(12) United States Patent
Tagashira

(10) Patent No.: US 11,382,236 B2
(45) Date of Patent: Jul. 5, 2022

(54) CONTROLLER

(71) Applicant: KAWASAKI JUKOGYO KABUSHIKI KAISHA, Kobe (JP)

(72) Inventor: Tsuyoshi Tagashira, Kakogawa (JP)

(73) Assignee: KAWASAKI JUKOGYO KABUSHIKI KAISHA, Kobe (JP)

(*) Notice: Subject to any disclaimer, the term of this patent is extended or adjusted under 35 U.S.C. 154(b) by 539 days.

(21) Appl. No.: 16/489,196

(22) PCT Filed: Feb. 26, 2018

(86) PCT No.: PCT/JP2018/007002
§ 371 (c)(1),
(2) Date: Aug. 27, 2019

(87) PCT Pub. No.: WO2018/155689
PCT Pub. Date: Aug. 30, 2018

(65) Prior Publication Data
US 2019/0380222 A1    Dec. 12, 2019

(30) Foreign Application Priority Data

Feb. 27, 2017    (JP) ............................. JP2017-035033

(51) Int. Cl.
*H05K 7/20*  (2006.01)
*H02B 1/28*  (2006.01)
*H02B 1/56*  (2006.01)

(52) U.S. Cl.
CPC ............... *H05K 7/20* (2013.01); *H02B 1/28* (2013.01); *H02B 1/56* (2013.01)

(58) Field of Classification Search
None
See application file for complete search history.

(56) References Cited

U.S. PATENT DOCUMENTS

| 8,159,823 B2 * | 4/2012 | Murakami | ............ | H01L 23/473 |
| | | | | 180/65.31 |
| 9,474,189 B2 * | 10/2016 | Kawauchi | ............... | H05K 5/06 |

(Continued)

FOREIGN PATENT DOCUMENTS

| CN | 202603115 U | * 12/2012 |
| JP | H06-284522 A | 10/1994 |

(Continued)

*Primary Examiner* — Courtney L Smith
(74) *Attorney, Agent, or Firm* — Oliff PLC

(57) ABSTRACT

A controller includes: a casing having a rectangular solid shape and including a front panel including an intake port, a rear panel including a discharge port and opposed to the front panel, and a heat transfer wall including an opening portion and perpendicular to the front panel and the rear panel; a fan inside the casing that sucks outside air into the casing through the intake port and supply the air to the inside of the casing; a regenerative resistor inside the casing at a position where the regenerative resistor is exposed to the outside through the opening portion of the heat transfer wall, the regenerative resistor being insertable and detachable through the opening portion; electronic parts inside the casing and including a servo amplifier which makes the regenerative resistor consume electric power; and a lid body detachably attached to the heat transfer wall to seal the opening portion.

7 Claims, 4 Drawing Sheets

(56) References Cited

U.S. PATENT DOCUMENTS

| | | | | |
|---|---|---|---|---|
| 10,499,514 | B2 * | 12/2019 | Miyamoto | H05K 7/20918 |
| 2003/0094920 | A1 * | 5/2003 | Numaguchi | H02K 11/33 |
| | | | | 318/801 |
| 2014/0203741 | A1 * | 7/2014 | Ohfuchi | B25J 19/0004 |
| | | | | 318/380 |
| 2020/0298707 | A1 * | 9/2020 | Suzuki | H02M 7/003 |

FOREIGN PATENT DOCUMENTS

| | | | | |
|---|---|---|---|---|
| JP | H08-064973 A | | 3/1996 | |
| JP | 2007-075908 A | | 3/2007 | |
| JP | 2007075908 A | * | 3/2007 | |
| JP | 2009-253183 A | | 10/2009 | |
| JP | 2012-138485 A | | 7/2012 | |
| JP | 2012-190876 A | | 10/2012 | |
| JP | 2014-140914 A | | 8/2014 | |
| JP | 2014140914 A | * | 8/2014 | B25J 19/0004 |
| JP | 2015-060872 A | | 3/2015 | |
| JP | 2016-216194 A | | 12/2016 | |
| KR | 1998-0018565 U | | 7/1998 | |
| WO | WO-2020071447 A1 | * | 4/2020 | |

* cited by examiner

CONTROLLER

TECHNICAL FIELD

The present invention relates to a controller of an industrial robot, a machine tool, or the like, and particularly to a controller including a regenerative resistor.

BACKGROUND ART

A controller of an industrial robot, a machine tool, or the like conventionally includes devices and elements (hereinafter referred to as "heat generating parts and the like") that generates heat. Examples of such devices and elements include: a CPU mounted on a control substrate; a semiconductor element used in a power supply device or a servo amplifier; and a regenerative resistor incorporated in or externally attached to a servo amplifier.

As the controller, there are an open-type controller configured such that an inside of a casing thereof is exposed to outside air and a sealed-type controller configured such that an inside of a casing thereof is sealed with respect to outside air for protection from dust and damp. A cooling structure of a sealed-type controller is disclosed in PTLs 1 and 2.

In the controller of PTL 1, a dustproof section and a ventilation section are formed by a dividing plate that divides the inside of the casing in a front-rear direction. The dustproof section is sealed in terms of dustproof. The ventilation section is formed by providing air intake/discharge holes at a rear portion of the casing. A heat exchanger configured to cool the dustproof section is provided at a front surface of the casing. A numerical value control device, a control panel, a main body portion of a servomotor control device, and the like are arranged at the dustproof section, and a heat sink portion of a servomotor driving device and a regenerative resistor are provided at the ventilation section.

The controller of PTL 2 includes: a casing sealed in terms of dustproof; a heat exchanger provided at a ceiling portion of the casing; a duct provided at a front portion of the casing; a first fan configured to take outside air into the heat exchanger; a second fan configured to supply inside air of the casing through a rear portion of the casing to the heat exchanger; a third fan configured to supply the inside air, having flowed through the heat exchanger, downward to a front portion of the casing; a fourth fan configured to suck the inside air into the duct; and a fifth fan configured to discharge the air from the duct into the casing.

CITATION LIST

Patent Literature

PTL 1: Japanese Laid-Open Patent Application Publication No. 6-284522
PTL 2: Japanese Laid-Open Patent Application Publication No. 2012-190876

SUMMARY OF INVENTION

Technical Problem

The inventors of the present application are considering to convert an open-type controller into a sealed-type controller by attaching option parts to the open-type controller. With this, the open-type controller and the sealed-type controller can include the same basic parts, and therefore, the sealed-type controller can be provided at low cost.

Solution to Problem

As a method of converting the open-type controller into the sealed-type controller, one method is to accommodate an open-type controller in a sealed container that is slightly larger than the open-type controller. However, according to this method, the controller increases in size, and therefore, a recent need to reduce the size cannot be satisfied. In addition, the heat generating parts and the like of the controller may not be cooled adequately.

The inventors of the present application have found that the open-type controller is converted into the sealed-type controller by sealing air intake/discharge openings of the casing of the open-type controller with covers. With this, the size increase of the controller can be suppressed as compared to a case were the controller is accommodated in the sealed container that is slightly larger than the controller. However, when a regenerative resistor that generates a large amount of heat among the heat generating parts and the like of the controller is provided inside the sealed casing, an excessive temperature increase of the controller is unavoidable.

The present invention was made under these circumstances, and an object of the present invention is to provide a controller which can be converted from an open-type controller into a sealed-type controller and can avoid an excessive temperature increase of electronic parts, the excessive temperature increase being caused due to heat generation of a regenerative resistor.

A controller according to one aspect of the present invention includes: a casing having a rectangular solid shape and including a front panel including an intake port, a rear panel including a discharge port and arranged so as to be opposed to the front panel, and a heat transfer wall arranged so as to be perpendicular to the front panel and the rear panel, the heat transfer wall including an opening portion through which an inside and outside of the casing communicate with each other; a fan arranged inside the casing and configured to suck outside air into the casing through the intake port and supply the air to the inside of the casing; a regenerative resistor provided inside the casing so as to be located at a position where the regenerative resistor is exposed to the outside through the opening portion of the heat transfer wall, the regenerative resistor being insertable and detachable through the opening portion; electronic parts provided inside the casing and including a servo amplifier which makes the regenerative resistor consume electric power; and a lid body detachably attached to the heat transfer wall and configured to seal the opening portion.

According to the controller configured as above, when the lid body is detached from the heat transfer wall, the regenerative resistor is exposed through the opening portion of the heat transfer wall, and the regenerative resistor can be taken out from the casing through the opening portion. To be specific, the controller can be converted from a state where the regenerative resistor is incorporated in the casing to a state where the regenerative resistor is externally attached to the casing. Therefore, when the controller is used in a state where the inside of the casing is sealed, the regenerative resistor is externally attached to the casing. With this, an excessive temperature increase of the electronic parts due to the heat generation of the regenerative resistor can be avoided.

Advantageous Effects of Invention

The present invention can provide a controller which can be converted from an open-type controller into a sealed-type controller and can avoid an excessive temperature increase of electronic parts, the excessive temperature increase being caused due to heat generation of a regenerative resistor.

DESCRIPTION OF EMBODIMENTS

Figure 1:
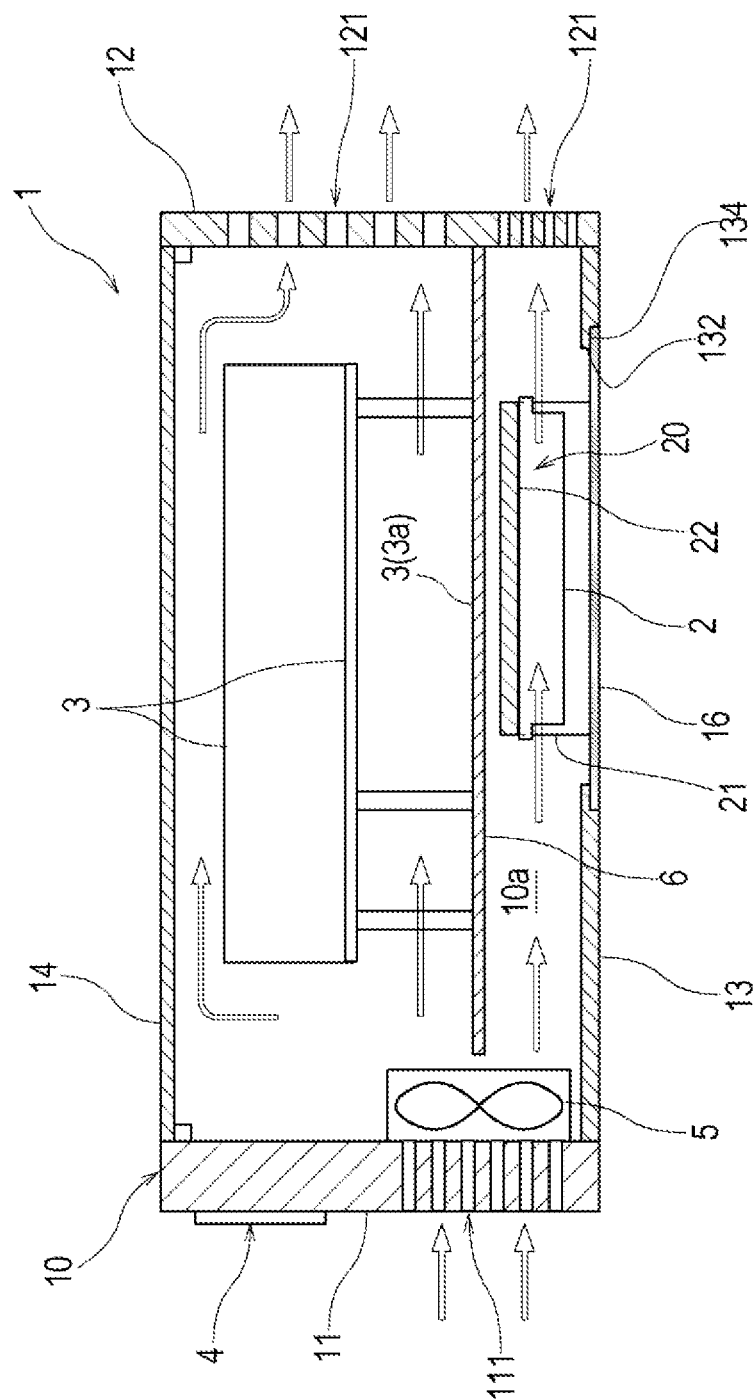
FIG. 1 is a sectional view showing an internal structure of a controller according to one embodiment of the present invention.

Next, an embodiment of the present invention will be described with reference to the drawings. FIG. 1 is a sectional view showing an internal structure of a controller 1 according to one embodiment of the present invention.

As shown in FIG. 1, the controller 1 according to one embodiment of the present invention includes a casing 10, electronic parts 3 provided inside the casing 10, a fan 5, and the like. In FIG. 1, the flow of cooling air for cooling the controller 1 is shown by white arrows.

The casing 10 has a substantially rectangular solid shape and is constituted by a front panel 11, a rear panel 12, a pair of side walls 15, a bottom wall 13, and an upper lid body 14. The front panel 11 and the rear panel 12 are arranged so as to be opposed to each other. In the present description, when viewed from the controller 1, a side where the front panel 11 exists is referred to as a "front" side, and a side where the rear panel 12 exists is referred to as a "rear" side.

The pair of side walls 15 and the bottom wall 13 are arranged so as to be perpendicular to the front panel 11 and the rear panel 12. The pair of side walls 15 and the bottom wall 13 are integrally molded in a trough shape by aluminum die cast and has the performance of a heat sink. To be specific, each of the pair of side walls 15 and the bottom wall 13 serves as a heat transfer wall made of a material which has higher heat conductivity at normal temperature than iron and resin. When the pair of side walls 15 and the bottom wall 13 are the heat transfer walls, cooling is promoted, and the casing 10 is reduced in size. However, the pair of side walls 15 and the bottom wall 13 may be made of a conventional casing material (iron, for example).

The front panel 11, the rear panel 12, the bottom wall 13, and the pair of side walls 15 form a box body whose upper surface is open. The upper lid body 14 is detachably attached to the box body so as to seal the open upper surface of the box body in terms of dustproof. Maintenance of the controller 1 is performed by detaching the upper lid body 14 from the casing 10.

A console 4 is provided at the front panel 11. In addition, a plurality of intake ports 111 through which the cooling air is taken into the casing 10 are provided at the front panel 11. A plurality of discharge ports 121 through which inside air of the casing 10 is discharged are provided at the rear panel 12.

The fan 5 is provided inside the casing 10 and just behind the front panel 11. However, the fan 5 may be provided just in front of the rear panel 12. By the operation of the fan 5, outside air is sucked into the casing 10 through the plurality of intake ports 111, and the inside air of the casing 10 is discharged through the plurality of discharge ports 121. Thus, the flow of the cooling air in the casing 10 from the front panel 11 to the rear panel 12 is generated.

A regenerative resistor 2 and its connector 24 (see FIG. 3) are provided inside the casing 10 and in the vicinity of the bottom wall 13.

The electronic parts 3 of the controller 1 other than the regenerative resistor 2 are provided inside the casing 10 and at positions upwardly away from the bottom wall 13. It should be noted that FIG. 1 representatively shows some of the electronic parts 3. Examples of the electronic parts 3 include a plurality of devices and elements, such as a control substrate, a power supply device, a servo amplifier which makes the regenerative resistor 2 consume regenerative electric power of a motor, and an I/O control substrate. A main control substrate 3a that is one of the electronic parts 3 has a width extending between the pair of side walls 15 and a front-rear direction size extending from just behind the fan 5 to the rear panel 12. The main control substrate 3a is arranged just above the regenerative resistor 2. A passage 10a for the cooling air that cools the regenerative resistor 2 is formed by the main control substrate 3a. The cooling air supplied to the passage 10a by the fan 5 flows around the regenerative resistor 2 along the bottom wall 13 and reaches the discharge ports 121.

Figure 2:
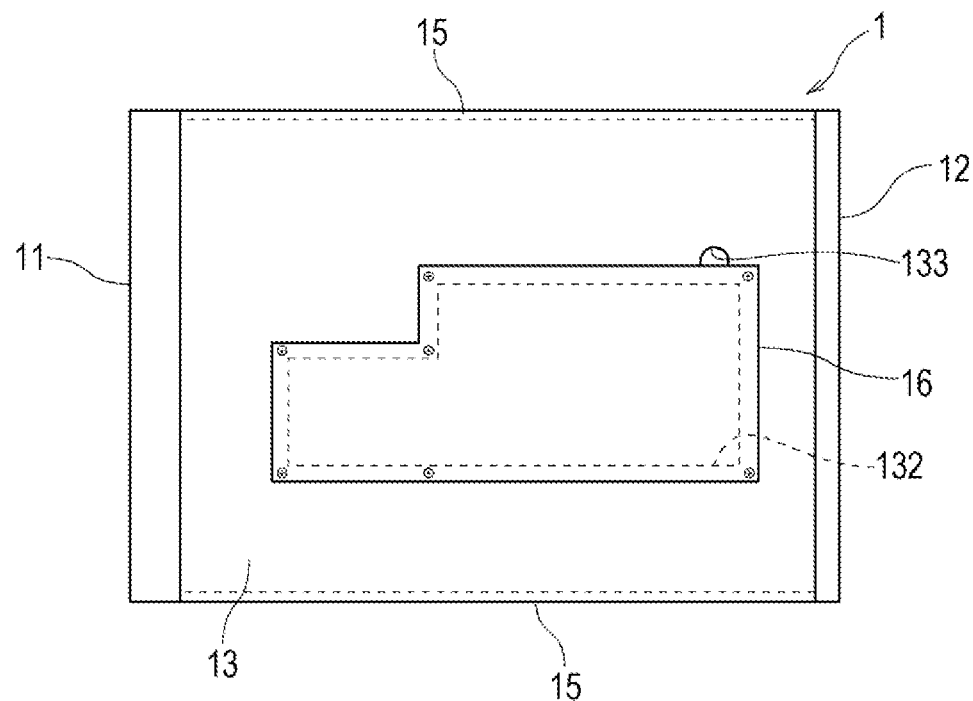
FIG. 2 is a bottom view of the controller shown in FIG. 1.
Figure 3:
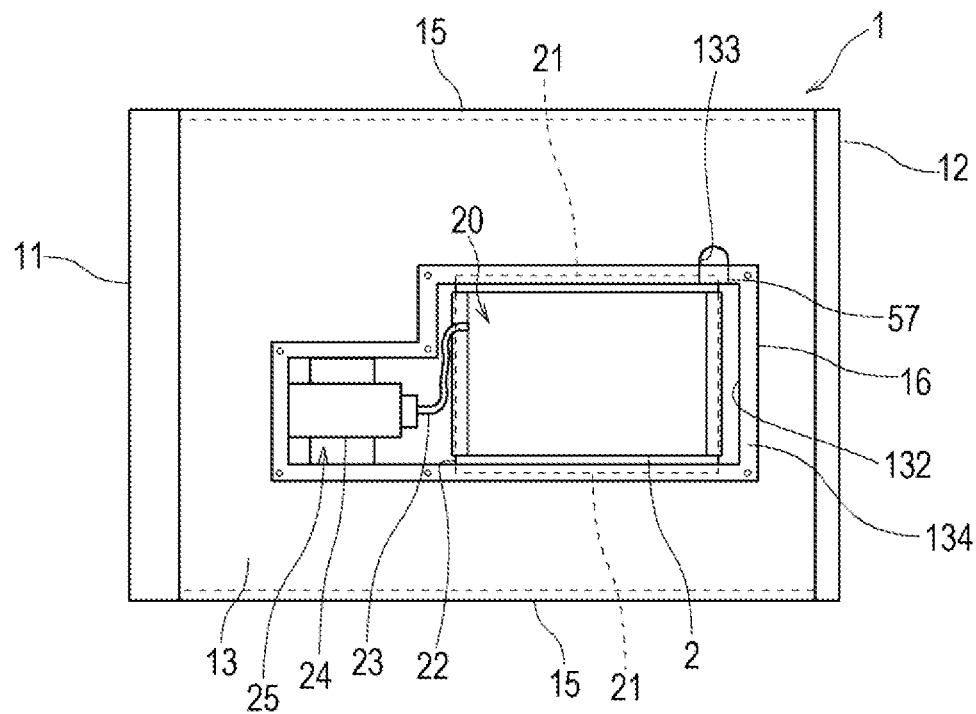
FIG. 3 is a bottom view in which a bottom lid body of the controller of FIG. 1 is detached.

FIG. 2 is a bottom view of the controller 1 shown in FIG. 1. FIG. 3 is a bottom view in which a bottom lid body 16 of the controller 1 of FIG. 1 is detached. As shown in FIGS. 2 and 3, an opening portion 132 through which the regenerative resistor 2 and the connector 24 are exposed to an outside is formed at the bottom wall 13 of the casing 10. The opening portion 132 is sealed in terms of dustproof by the bottom lid body 16 which is attachable to and detachable from the bottom wall 13. When the bottom lid body 16 is detached from the bottom wall 13, an inside and outside of the casing 10 communicate with each other through the opening portion 132. A lip portion 134 is formed at an opening edge of the opening portion 132. The lip portion 134 and a periphery of the bottom lid body 16 are coupled to each other through a dustproof seal (not shown).

A resistor attaching portion 20 to which the regenerative resistor 2 is attached is provided inside the opening portion 132. The resistor attaching portion 20 is constituted by an attaching wall 22 and a pair of side walls 21. The attaching wall 22 is parallel to the bottom wall 13. The pair of side walls connect the attaching wall 22 and the opening edge of the bottom wall 13. The resistor attaching portion 20 is formed integrally with the bottom wall 13. When the bottom wall 13 and the resistor attaching portion 20 are viewed from the front-rear direction, the combination of the bottom wall 13 and the resistor attaching portion 20 has a hat shape.

The regenerative resistor 2 is detachably attached to the attaching wall 22 of the resistor attaching portion 20 by fastening members, such as bolts. Walls in front of and behind the resistor attaching portion 20 do not exist. As shown in FIG. 1, the regenerative resistor 2 attached to the resistor attaching portion 20 exists in a space communicating with the inside of the casing 10, and the cooling air flows around the regenerative resistor 2 in the front-rear direction.

A connector attaching portion 25 is provided inside the opening portion 132. The connector 24 for connecting the regenerative resistor 2 to the servo amplifier is attached to the connector attaching portion 25. The connector 24 attached to the connector attaching portion 25 is connected to a connector provided at an end portion of a regenerative resistance connecting cable 23 connected to the regenerative resistor 2.

A cable pull-out portion 133 is formed at the opening edge of the opening portion 132. The regenerative resistance connecting cable 23 can be pulled out from the inside of the casing 10 to the outside through the cable pull-out portion 133. A dustproof seal 57 is provided at the cable pull-out portion 133. When the opening portion 132 is sealed by the bottom lid body 16, a gap between the cable pull-out portion 133 and the regenerative resistance connecting cable 23 is sealed by the dustproof seal 57 in terms of dustproof.

By attaching option parts to the controller 1 configured as above, the controller 1 can be converted into the sealed-type controller 1 sealed in terms of dustproof.

Figure 4:
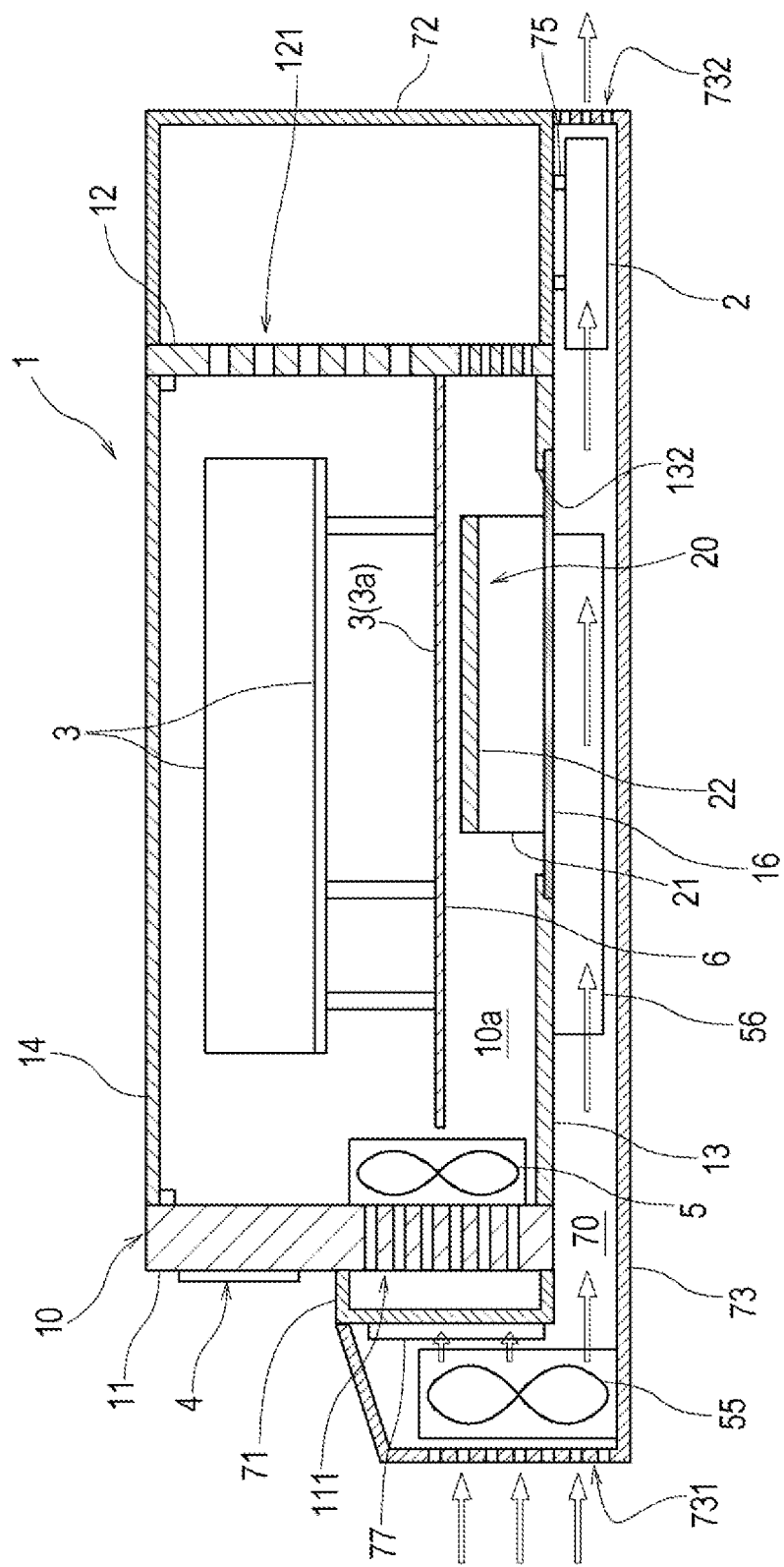
FIG. 4 is a sectional view showing the internal structure of the controller which has been converted into the sealed-type controller.
Figure 5:
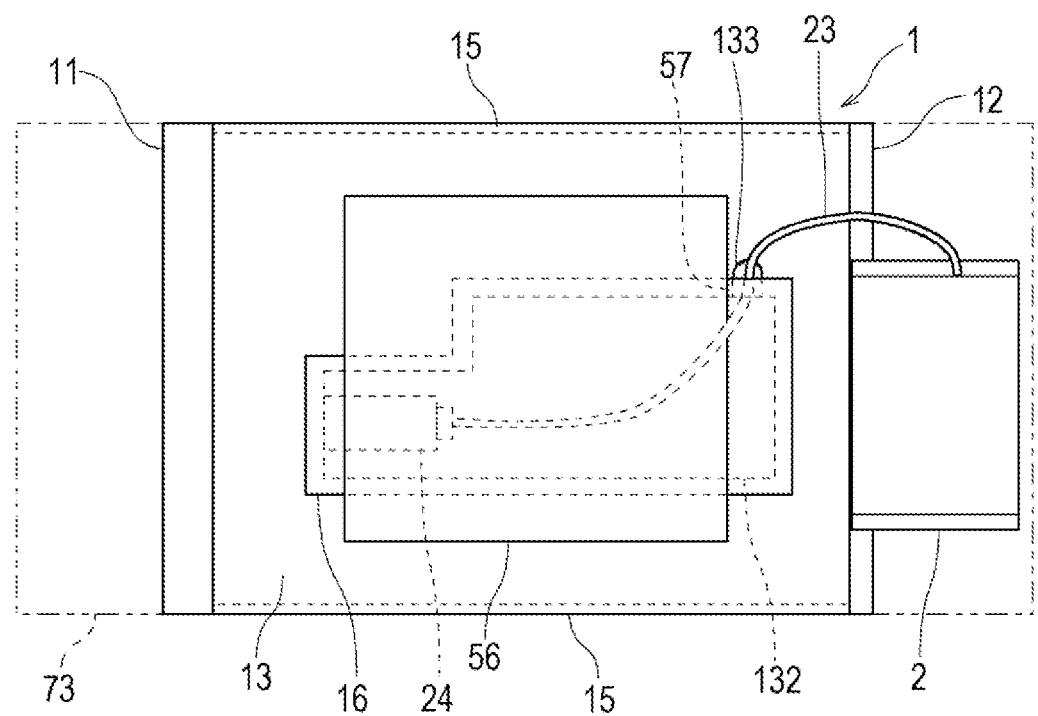
FIG. 5 is a bottom view in which a bottom cover of the controller of FIG. 4 is transparent.

FIG. 4 is a sectional view showing the internal structure of the controller 1 which has been converted into the sealed-type controller. FIG. 5 is a bottom view in which a bottom cover 73 of the controller 1 of FIG. 4 is transparent. In FIG. 4, the flow of the cooling air is shown by white arrows. In FIG. 5, the bottom cover 73 is shown by a two-dot chain line.

As shown in FIGS. 4 and 5, a front cover 71 is attached to the front panel 11 of the sealed-type controller 1. The front cover 71 seals the intake ports 111 formed at the front panel 11. The front cover 71 selectively covers a region, where the plurality of intake ports 111 are formed, in a front surface of the front panel 11, and with this, collectively closes the plurality of intake ports 111. The number of front covers 71 may be plural. A gap between the front panel 11 and the front cover 71 is sealed by a dustproof seal (not shown) in terms of dustproof. A heat sink 77 is provided at a front surface of the front cover 71.

A rear cover 72 is attached to the rear panel 12. The rear cover 72 seals the discharge ports 121 formed at the rear panel 12. The rear cover 72 covers an entire rear surface of the rear panel 12, and with this, collectively closes the plurality of discharge ports 121. The number of rear covers 72 may be plural. A gap between the rear panel 12 and the rear cover 72 is sealed by a dustproof seal (not shown) in terms of dustproof.

When converting the open-type controller 1 into the sealed-type controller, the regenerative resistor 2 incorporated in the casing 10 is externally attached to the casing 10. To be specific, the bottom lid body 16 is once detached from the bottom wall 13 of the casing 10, and the regenerative resistor 2 is detached from the resistor attaching portion 20 through the exposed opening portion 132. Then, the regenerative resistor 2 detached from the resistor attaching portion 20 is attached to a base 75 by fastening members, such as bolts. The base 75 is provided on a bottom surface of the rear cover 72. The regenerative resistor 2 attached to the base 75 is located outside the casing 10 and away from the electronic parts 3.

Since the regenerative resistor 2 is arranged outside the casing 10, the regenerative resistance connecting cable 23 connecting the regenerative resistor 2 and the connector 24 is pulled out from the opening portion 132 through the cable pull-out portion 133 to the outside of the casing 10. The regenerative resistance connecting cable 23 may be extended by an extension cable. As above, after the regenerative resistor 2 is taken out from the casing 10, the bottom lid body 16 is attached to the opening portion 132. With this, the casing 10 is sealed by the front cover 71, the rear cover 72, and the bottom lid body 16 in terms of dustproof.

A huge heat sink 56 is provided on a bottom surface of the bottom wall 13. The heat sink 56 is attached to the bottom wall 13 so as to cover, from below, the bottom wall 13 and the bottom lid body 16 which seals the opening portion 132.

A lower surface of the rear panel 12, the bottom wall 13 of the casing 10, and lower and front surfaces of the front cover 71 are covered with the open-type bottom cover 73. The bottom cover 73 is a heat transfer wall cover configured to cover the bottom wall 13 that is the heat transfer wall.

A plurality of intake ports 731 are provided on a front surface of the bottom cover 73. A plurality of discharge ports 732 are provided on a rear surface of the bottom cover 73. A cooling passage 70 is formed inside the bottom cover 73. The cooling air taken from the outside through the intake ports 731 flows in the cooling passage 70 along a surface of the bottom wall 13. The heat sink 56 and the regenerative resistor 2 are arranged inside the cooling passage 70.

A fan 55 is provided inside the bottom cover 73 and in front of the front cover 71. By the operation of the fan 55, outside air is taken into the inside of the bottom cover 73 through the plurality of intake ports 731.

The heat sink 77 exists within a range of a vertical size of the fan 55. The air supplied from the fan 55 hits the heat sink 77 to make the heat sink 77 radiate heat. By the heat radiation of the heat sink 77, the front cover 71 to which the heat sink 77 is attached, the front panel 11 to which the front cover 71 is fixed, and the like are cooled.

By the air supply of the fan 55, the cooling air is supplied to the cooling passage 70 formed inside the bottom cover 73. The flow of the cooling air hits the heat sink 56 to make the heat sink 56 radiate heat. By the heat radiation of the heat sink 56, the bottom wall 13 to which the heat sink 56 is attached and the pair of side walls 15 are cooled, and the inside of the casing 10 is also cooled.

The flow of the cooling air in the cooling passage 70 hits the regenerative resistor 2 to make the regenerative resistor 2 radiate heat. The regenerative resistor 2 is provided at a most downstream section of the flow of the cooling air in the cooling passage 70. After the cooling air cools the regenerative resistor 2, the cooling air is discharged to the outside through the discharge ports 732.

As described above, the controller 1 of the present embodiment includes the casing 10 having a rectangular solid shape and including: the front panel 11 including the intake ports 111; the rear panel 12 including the discharge ports 121 and arranged so as to be opposed to the front panel 11; and the bottom wall 13 (heat transfer wall) arranged so as to be perpendicular to the front panel 11 and the rear panel 12, the bottom wall 13 including the opening portion 132 through which an inside and outside of the casing 10 communicate with each other. Further, the controller 1 includes: the fan 5 arranged inside the casing 10 and configured to suck outside air into the casing 10 through the intake ports 111 and supply the air to the inside of the casing 10; the regenerative resistor 2 provided inside the casing 10 so as to be located at a position where the regenerative resistor 2 is exposed to the outside through the opening portion 132 of the bottom wall 13, the regenerative resistor 2 being insertable and detachable through the opening portion 132; the electronic parts 3 provided inside the casing 10 and including a servo amplifier which makes the regenerative resistor 2 consume electric power; and the bottom lid body 16 (lid body) detachably attached to the bottom wall 13 and configured to seal the opening portion 132.

In the above embodiment, the controller 1 is horizontally placed with the bottom wall 13 facing downward. However, the controller 1 may be vertically placed with the side wall 15 facing downward. Further, in the above embodiment, the opening portion 132 is provided at the bottom wall 13, and the regenerative resistor 2 is arranged inside the opening portion 132. However, the opening portion may be provided at the side wall 21 that is the heat transfer wall as with the bottom wall 13, and the regenerative resistor 2 may be arranged inside the opening portion.

According to the controller 1 configured as above, when the bottom lid body 16 is detached from the bottom wall 13, the regenerative resistor 2 is exposed through the opening portion 132 of the bottom wall 13, and the regenerative resistor 2 can be taken out from the casing 10 through the opening portion 132. To be specific, the controller 1 can be converted from a state where the regenerative resistor 2 is incorporated in the casing 10 to a state where the regenerative resistor 2 is externally attached to the casing 10. Therefore, when the controller 1 is used in a state where the inside of the casing 10 is sealed (i.e., when the controller 1 is used as the sealed-type controller), the regenerative resistor 2 is externally attached to the casing 10. With this, an excessive temperature increase of the electronic parts 3 due to the heat generation of the regenerative resistor 2 can be avoided.

In the controller 1 according to the above embodiment, the resistor attaching portion 20 is provided inside the opening portion 132 of the bottom wall 13 (heat transfer wall), and the resistor attaching portion 20 includes: the attaching wall 22 located inside the casing 10 and parallel to the bottom wall 13; and the pair of side walls 21 connecting the attaching wall 22 and the bottom wall 13. The regenerative resistor 2 is detachably attached to the attaching wall 22.

As above, since the regenerative resistor 2 is attachable to and detachable from the resistor attaching portion 20 provided at the opening portion 132, the regenerative resistor 2 can be easily taken out from the casing 10. Side portions of the resistor attaching portion 20 other than the pair of side walls 21 are open, and the regenerative resistor 2 attached to the resistor attaching portion 20 exists in a space communicating with the inside of the casing 10.

In the controller 1 according to the above embodiment, the bottom wall 13 and the resistor attaching portion 20 are configured as an integrally molded body (aluminum molded article) made of an aluminum alloy.

As above, the regenerative resistor 2 is attached to the resistor attaching portion 20 made of a material having high heat conductivity, and the resistor attaching portion 20 and the bottom wall 13 are formed integrally. With this, the heat generated by the regenerative resistor 2 can be radiated to the outside through the resistor attaching portion 20 and the bottom wall 13.

In the controller 1 according to the above embodiment, the cable pull-out portion 133 is formed at the opening edge of the opening portion 132 of the bottom wall 13, the cable pull-out portion 133 forming a passage through which the regenerative resistance connecting cable 23 connected to the regenerative resistor 2 is pulled out from the inside of the casing 10 to the outside. Then, the dustproof seal 57 is provided at the cable pull-out portion 133, the dustproof seal 57 sealing between the cable pull-out portion 133 and the regenerative resistance connecting cable 23, extending through the cable pull-out portion 133, by sealing the opening portion 132 with the bottom lid body 16.

With this, in a state where the opening portion 132 is sealed with the bottom lid body 16, the connector 24 arranged inside the casing 10 and the regenerative resistor 2 arranged outside the casing 10 can be connected to each other by the regenerative resistance connecting cable 23.

In the controller 1 according to the above embodiment, the connector 24 to which the regenerative resistance connecting cable 23 is connected is provided inside the casing 10 so as to be located at a position where the connector 24 is exposed to the outside through the opening portion 132 of the bottom wall 13.

With this, when the opening portion 132 is exposed by detaching the bottom lid body 16 from the bottom wall 13, work of connecting the regenerative resistance connecting cable 23 to the connector 24 can be easily performed. In addition, work of connecting an extension cable of the regenerative resistance connecting cable 23 to the connector 24 can be easily performed.

The controller 1 according to the above embodiment further includes: the front cover 71 attached to the front panel 11 and configured to seal the intake ports 111; the rear cover 72 attached to the rear panel 12 and configured to seal the discharge ports 121; the base 75 provided at the rear cover 72, the regenerative resistor 2 being detachably attached to the base 75; the open-type bottom cover 73 (heat transfer wall cover) covering at least the bottom lid body 16 (heat transfer wall) and the regenerative resistor 2 attached to the base 75, the bottom cover 73 forming the cooling passage 70 extending along the surface of the bottom lid body 16; and the fan 55 provided inside the bottom cover 73 and configured to suck the outside air into the cooling passage 70 and supply the air to the cooling passage 70.

With this, the controller 1 can be converted from the open-type controller into the sealed-type controller.

Further, the controller 1 which has been converted into the sealed-type controller includes the heat sink 77 provided inside the cooling passage 70 and attached to the bottom wall 13 so as to cover the bottom wall 13 and the bottom lid body 16 sealing the opening portion 132.

As above, since the heat sink 77 is provided so as to cover the bottom wall 13 and the bottom lid body 16, an adequate heat radiating area of the heat sink 77 can be secured.

The foregoing has explained a preferred embodiment of the present invention. The specific structures and/or functional details in the above embodiment may be modified within the scope of the present invention.

REFERENCE SIGNS LIST 1 controller
2 regenerative resistor
3 electronic part
4 console
5 fan
10 casing
11 front panel
111 intake port
12 rear panel
121 discharge port
13 bottom wall (one example of heat transfer wall)
132 opening portion
133 cable pull-out portion
134 lip portion
14 upper lid body
15 side wall (one example of heat transfer wall)
16 bottom lid body
20 resistor attaching portion 21 side wall
22 attaching wall
23 regenerative resistance connecting cable
24 connector
25 connector attaching portion
55 fan
56 heat sink
57 dustproof seal
70 cooling passage
71 front cover
72 rear cover
73 bottom cover (heat transfer wall cover)
731 intake port
732 discharge port
75 base
77 heat sink

The invention claimed is:

1. A controller comprising:
a casing having a rectangular solid shape and including
a front panel including an intake port,
a rear panel including a discharge port and arranged so as to be opposed to the front panel, and
a heat transfer wall arranged so as to be perpendicular to the front panel and the rear panel, the heat transfer wall including an opening portion through which an inside and outside of the casing communicate with each other;
a fan arranged inside the casing and configured to suck outside air into the casing through the intake port and supply the air to the inside of the casing;
a regenerative resistor provided inside the casing so as to be located at a position where the regenerative resistor is exposed to the outside through the opening portion of the heat transfer wall, the regenerative resistor being insertable and detachable through the opening portion;
electronic parts provided inside the casing and including a servo amplifier which makes the regenerative resistor consume electric power; and
a lid body detachably attached to the heat transfer wall and configured to seal the opening portion.

2. The controller according to claim 1, wherein:
a resistor attaching portion is provided inside the opening portion of the heat transfer wall;
the resistor attaching portion includes
an attaching wall located inside the casing and parallel to the heat transfer wall and
a pair of side walls connecting the attaching wall and the heat transfer wall; and
the regenerative resistor is detachably attached to the attaching wall.

3. The controller according to claim 2, wherein the heat transfer wall and the resistor attaching portion are configured as an integrally molded body made of an aluminum alloy.

4. The controller according to claim 1, wherein:
a cable pull-out portion is formed at an opening edge of the opening portion of the heat transfer wall, the cable pull-out portion forming a passage through which a regenerative resistance connecting cable connected to the regenerative resistor is pulled out from the inside of the casing to the outside; and
a dustproof seal is provided at the cable pull-out portion, the dustproof seal sealing between the cable pull-out portion and the regenerative resistance connecting cable, extending through the cable pull-out portion, by sealing the opening portion with the lid body.

5. The controller according to claim 4, wherein a connector to which the regenerative resistance connecting cable is connected is provided inside the casing so as to be located at a position where the connector is exposed to the outside through the opening portion of the heat transfer wall.

6. The controller according to claim 1, further comprising:
a front cover attached to the front panel and configured to seal the intake port;
a rear cover attached to the rear panel and configured to seal the discharge port;
a base provided at the rear cover, the regenerative resistor being detachably attached to the base;
an open-type heat transfer wall cover covering at least the heat transfer wall and the regenerative resistor attached to the base, the heat transfer wall cover forming a cooling passage extending along a surface of the heat transfer wall; and
a fan provided inside the heat transfer wall cover and configured to suck the outside air into the cooling passage and supply the air to the cooling passage.

7. The controller according to claim 6, further comprising a heat sink provided inside the cooling passage and attached to the heat transfer wall so as to cover the heat transfer wall and the lid body sealing the opening portion.

* * * * *